(12) United States Patent
Kaneyama et al.

(10) Patent No.: US 6,573,501 B2
(45) Date of Patent: Jun. 3, 2003

(54) HOLOGRAPHY TRANSMISSION ELECTRON MICROSCOPE

(75) Inventors: Toshikatsu Kaneyama, Tokyo (JP); Hiromi Nunome, Tokyo (JP); Masaki Takeguchi, Ibaraki (JP)

(73) Assignee: JEOL Ltd., Tokyo (JP)

( * ) Notice: Subject to any disclaimer, the term of this patent is extended or adjusted under 35 U.S.C. 154(b) by 255 days.

(21) Appl. No.: 09/789,484

(22) Filed: Feb. 20, 2001

(65) Prior Publication Data

US 2001/0042830 A1 Nov. 22, 2001

(30) Foreign Application Priority Data

Feb. 21, 2000 (JP) ......................................... 2000-042570

(51) Int. Cl.[7] ............................ H01J 37/00; H01J 37/26
(52) U.S. Cl. ...................... 250/311; 250/306; 250/307; 250/308; 250/310; 250/398; 250/396 R; 250/396 ML
(58) Field of Search .................................. 250/306, 307, 250/308, 310, 311, 398, 396 R, 396 ML

(56) References Cited

U.S. PATENT DOCUMENTS 5,221,844 A * 6/1993 van der Mast et al. ...... 250/398
5,298,747 A * 3/1994 Ichikawa et al. ............ 250/306
5,432,347 A * 7/1995 Coene ......................... 250/307
6,150,657 A * 11/2000 Kimoto et al. ............... 250/305

OTHER PUBLICATIONS

"Where to place the image plane to record off–axis holograms?", Helmut Banzhof and Hannes Lichte, *Electron Microscopy 1998*, Paper presented at ICEM14, Cancun, Mexico, Aug. 31 to Sep. 4, 1998, Symposium Q, vol. 1, pp. 547–548.

* cited by examiner

Primary Examiner—John R. Lee
Assistant Examiner—David A. Vanore
(74) Attorney, Agent, or Firm—Webb Ziesenheim Logsdon Orkin & Hanson, P.C.

(57) ABSTRACT

A holography electron microscope permitting electron holography without limitations on the magnification. An electron biprism is mounted between a system of intermediate lenses and a system of projector lenses. The objective lens and the system of intermediate lenses form a crossover at a given position between intermediate lenses and the electron biprism and, at the same time, focus a magnified image at a certain position between the electron biprism and projector lenses. Since the system of intermediate lenses is made up of three or more stages of lenses, it forms a crossover at a given position and focuses a magnified image at a certain position.

5 Claims, 8 Drawing Sheets

HOLOGRAPHY TRANSMISSION ELECTRON MICROSCOPE

BACKGROUND OF THE INVENTION

1. Field of the Invention

The present invention relates to a holography electron microscope comprising a transmission electron microscope (TEM) equipped with an electron biprism.

2. Description of the Related Art

A holography electron microscope comprises a TEM having electron optics in which an electron biprism is inserted. This instrument is constructed as shown in FIG. 7. Shown in this figure are an electron gun 1, an illumination lens system 2, a specimen 3, a specimen holder 4, an objective lens 5, an auxiliary objective lens 6, an electron biprism 7, intermediate lenses 8, a projector lens 9, and an observation/recording device 10. This observation/recording device 10 is made of a fluorescent screen, a photography device, or a TV camera.

When the electron biprism 7 is not operated, the instrument functions as a normal TEM. That is, the electron beam produced by the electron gun 1 is directed onto the specimen 3 via the illumination lens system 2. The electron beam transmitted through the specimen 3 is magnified by a magnification-and-projection system comprising the objective lens 5, the auxiliary objective lens 6, the intermediate lenses 8, and the projector lens 9. Finally, the electron beam is projected as a TEM image onto the observation/recording device 10.

The structure and operation of the electron biprism 7 are next described. As shown in FIG. 8, the electron biprism 7 comprises a filament 11 and two electrodes 12 and 13 located on the opposite sides of the filament 11. In FIG. 8, the crossover position that is the position of the back focal plane of the objective lens 5 is indicated by C. The image plane of the objective lens 5 is indicated by IP.

The filament 11 is normally made of thin wire of platinum having a diameter of about 1 μm. During operation, a positive voltage of hundreds of volts is applied to the filament 11. The electrodes 12 and 13 are grounded. Sometimes, none of the electrodes 12 and 13 may be mounted. In this example, it is assumed that the instrument is fitted with these electrodes 12 and 13.

When a given voltage is applied to the filament 11 to operate the electron biprism 7, the electron beam transmitted through the specimen 3 is divided into two by the filament 11. The resulting two portions of the electron beam overlap each other as shown, producing interference. Interference fringes are created in the region in which interference occurs. In FIG. 8, the width of the overlap (hereinafter referred to as the interference region) is indicated by D. The auxiliary objective lens 6 is omitted in FIG. 8.

In this case, the specimen 3 is examined as follows. One of the two portions obtained by dividing the electron beam by the filament 11 passes through a space in which the specimen does not exist (i.e., a vacuum). The other portion is transmitted through the specimen. In this way, the interference fringes created in the interference region by the two portions of the electron beam contain information about the phase shift that electrons transmitted through the specimen undergo during passage through the specimen.

Since the electron beam transmitted through the specimen contains information about an object of interest, the beam is known as an object wave. The electron beam transmitted through a vacuum is not affected at all and, therefore, can provide a reference. Hence, this beam is termed a reference wave. The interference fringes created in the interference region are known as an electron hologram. Procedures for analyzing the phase of the object wave based on the electron hologram and analyzing information about the specimen are referred to as electron holography.

The electron hologram created by the electron biprism 7 is magnified by the rear intermediate lenses 8 and projector lens 9 and focused onto the observation/recording device 10. The image plane of the objective lens 5, i.e., the object plane of the intermediate lenses 8, is made noncoincident with the position of the electron biprism 7. In particular, the image plane of the objective lens 5 is normally placed in position below the electron biprism 7.

The spacing I between the interference fringes of the electron hologram and the width D of the interference region are next described. The spacing between the interference fringes depends on the voltage applied to the filament 11 of the electron biprism 7 and on the position of the image plane IP of the objective lens 5. The spacing I between the interference fringes at the image plane IP of the objective lens 5 is given by:

$$I = \frac{(a+b)\lambda}{2a\varphi V_f} \quad (1)$$

where a is the distance from the crossover position C of FIG. 8 to the filament 11, b is the distance from the filament 11 to the image plane IP, λ is the wavelength of electrons, $V_f$ is the voltage applied to the filament 11, and Φ is the deflection sensitivity of the electron biprism 7. The width D of the interference region from which the thickness of the filament 11 itself of the electron biprism 7 is subtracted is given by:

$$D = 2b\varphi V_f - \frac{2(a+b)r}{a} \quad (2)$$

where r is the radius of the filament 11 of the electron biprism 7.

In electron holography, the spacing I between the interference fringes of the electron hologram and the value of the width D of the interference region converted onto the specimen surface are important. The spacing $I_s$ between the interference fringes converted onto the specimen surface is given by:

$$I_s = \frac{(a+b)\lambda}{2aM\varphi V_f} \quad (3)$$

The width of the interference region $D_s$ converted onto the specimen plane is given by:

$$Ds = \frac{2b\varphi V_f}{M} - \frac{2(a+b)r}{Ma} \quad (4)$$

The magnification M of the objective lens 5 at the image plane IP is used in Eqs. (3) and (4). This magnification M is now discussed. The objective lens 5 is normally excited strongly. Its focal distance f can be made sufficiently smaller than the sum of the distances (a+b) and so the magnification can be given by:

$$M = \frac{a+b}{f} \quad (5)$$

Accordingly, where the objective lens 5 is excited strongly and its focal distance f is made sufficiently smaller than the sum of the distances (a+b), the interference fringe spacing $I_s$ and the interference region width $D_s$ converted onto the specimen surface can be given by Eqs. (6) and (7), respectively, by substituting Eq. (5) into Eqs. (3) and (4).

$$I_s = \frac{f\lambda}{2a\varphi V_f} \quad (6)$$

$$Ds = \frac{2fb\varphi V_f}{a+b} - \frac{2fr}{a} \quad (7)$$

An example of the calculation is now given. It is assumed that the accelerating voltage for the electron beam is 200 kV and that a=150 mm. Normally, the distance b is about 10 mm. These are practical values. In this case, the deflection sensitivity Φ of the electron biprism 7 is roughly $1\times10^{-6}$ rad/V. If we assume that $V_f$=200 V, f=2 mm, and r=0.3 μm, then $I_s$=0.084 nm and $D_s$=42 nm.

It is assumed that the resolution of a recorder set in the observation/recording device 10 is 20 μm. To record an electron hologram, the final image magnification (total magnification) needs to be in excess of 250,000 times. The width of the interference region of the electron hologram recorded when the final image magnification (total magnification) is 250,000 times is as narrow as 10 mm. To secure a sufficient field of view by increasing the width of the interference region, the voltage $V_f$ applied to the filament 11 may be increased. However, as can be easily seen from Eq. (1), if the voltage $V_f$ applied to the filament 11 is increased, the spacing I between the interference fringes at the image plane IP of the objective lens 5 narrows. Therefore, if it is attempted to increase the effective field of view at the position of the observation/recording device 10, the magnification will be shifted to higher values.

A method of solving this problem consists of exciting the objective lens 5 weakly, bringing the position of the image plane IP close to the objective lens 5, and deenergizing the first stage of the intermediate lenses 8. That is, the first stage of the intermediate lens is not excited. This method makes it possible to set the distance b to a large value of tens of millimeters. For the same voltage $V_f$ applied to the filament 11 and for the same spacing I, the width D of the interference region D of the electron hologram can be increased.

In this way, a holography electron microscope adopts peculiar use conditions different from those of a normal TEM.

An imaging mode that is different from normal use conditions of a TEM as described above and intended to secure a wider interference region width is herein referred to as the intermediate magnification mode. On the other hand, an imaging mode in which the objective lens 5 is excited strongly and the focal distance is set to a small value is referred to as the high magnification mode. An imaging mode in which the objective lens 5 is excited very weakly or the auxiliary objective lens 6 is used to provide low magnifications of thousands of times is referred to as the low magnification mode. However, in the low magnification mode, high-resolution imaging owing to the objective lens 5 is sacrificed. Therefore, magnifications of thousands of times are not used in practical applications. There are three imaging modes, i.e., low, intermediate, and high magnification modes, in this way. The magnifications, interference fringe spacings, and interference region widths in these modes are given in the following table.

TABLE 1

| mode | magnification | spacing between interference fringes | width of interference range |
|---|---|---|---|
| low magnification mode | thousands of times | about 10 nm | microns |
| intermediate magnification mode | more than about 100,000× | about 0.2 to 1 nm | tens of nanometers |
| high magnification mode | more than about 500,000× | about 0.1 nm | from nanometers to tens of nanometers |

In the prior art holography electron microscope, the electron biprism 7 is placed between the objective lens 5 and the system of intermediate lenses 8 as shown in FIG. 7. Because the biprism 7 is mounted as an option or an accessory for the TEM, the biprism is positioned in a space that can accommodate it. This space lies between the objective lens 5 and the system of intermediate lenses 8.

As mentioned previously, the prior art holography electron microscope has three imaging modes (i.e., low, intermediate, and high magnification modes). It is to be noted that there is a blank magnification range between the low and intermediate magnification modes as can be seen from Table 1 above. However, there is no blank magnification range between the intermediate and high magnification modes and so the magnification can be varied continuously.

Therefore, with the prior art holography electron microscope, magnifications from about tens of thousands of times to 100,000× cannot be accomplished. In terms of the interference region width, modes of hundreds of nanometers cannot be achieved.

Furthermore, even at an achievable magnification, the magnification mode must be selected according to the size of the object to be observed. In consequence, the magnification must be set meticulously taking account of even the resolution of the observation/recording device 10.

In this way, in the prior art holography electron microscope, limitations are imposed on the magnification. Also, much care must be exercised in the use of the instrument. Hence, electron holography based on transmission electron microscopy has not been a research tool that can be handled easily by anyone.

SUMMARY OF THE INVENTION

The present invention is intended to solve the foregoing problems. It is an object of the present invention to provide a holography electron microscope permitting one to easily perform electron holography without limitations on the magnification.

A holography electron microscope built in accordance with the present invention and solving the foregoing problems has an electron biprism located between a system of intermediate lenses and a system of projector lenses. Lenses, such as the intermediate lenses, located closer to the electron gun than the electron biprism permits one to set the magnification at will.

Other objects and features of the invention will appear in the course of the description thereof, which follows.

DESCRIPTION OF THE PREFERRED EMBODIMENTS

Figure 1:
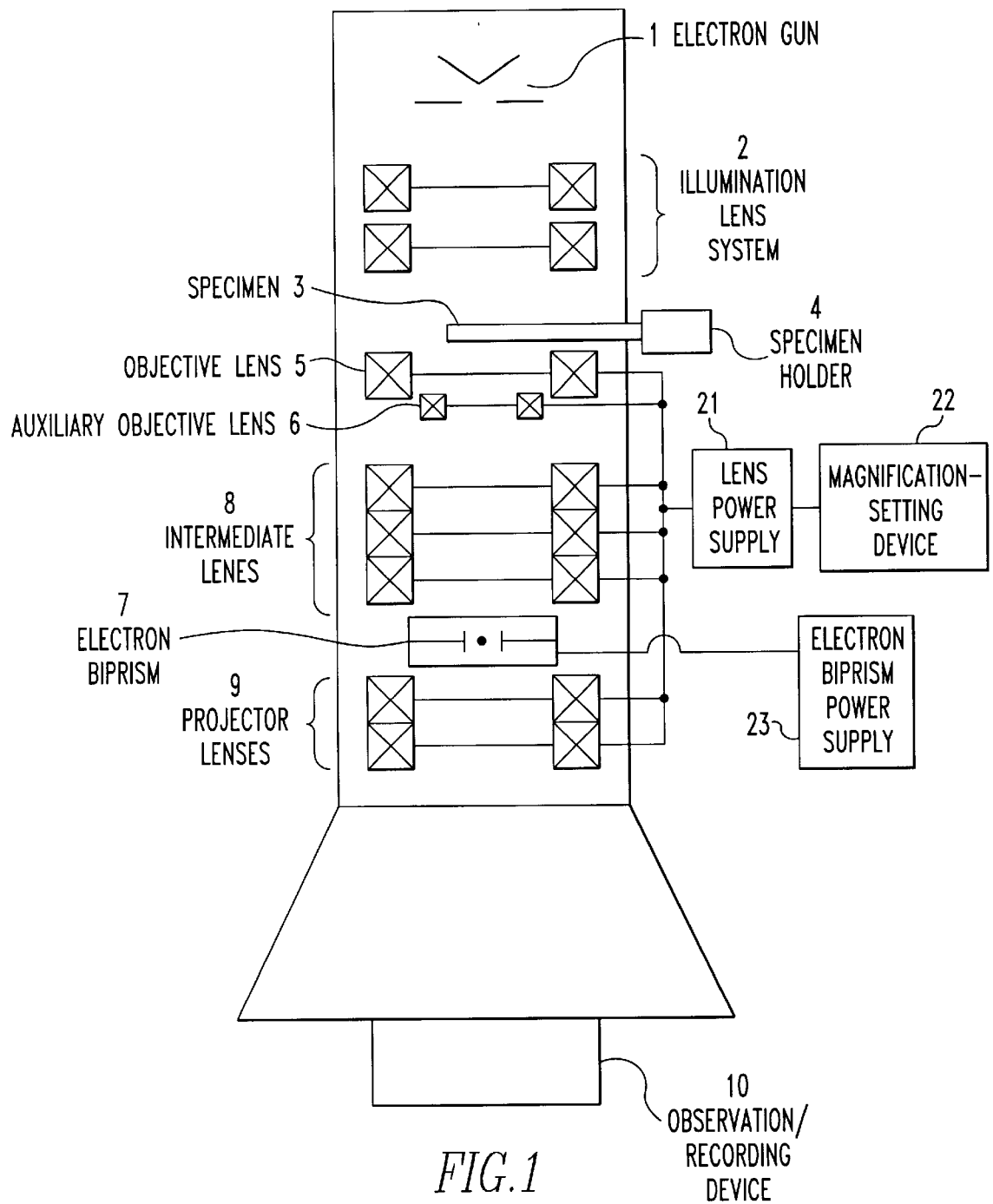
FIG. 1 is a schematic diagram of a holography electron microscope in accordance with one embodiment of the present invention.
Figure 7:
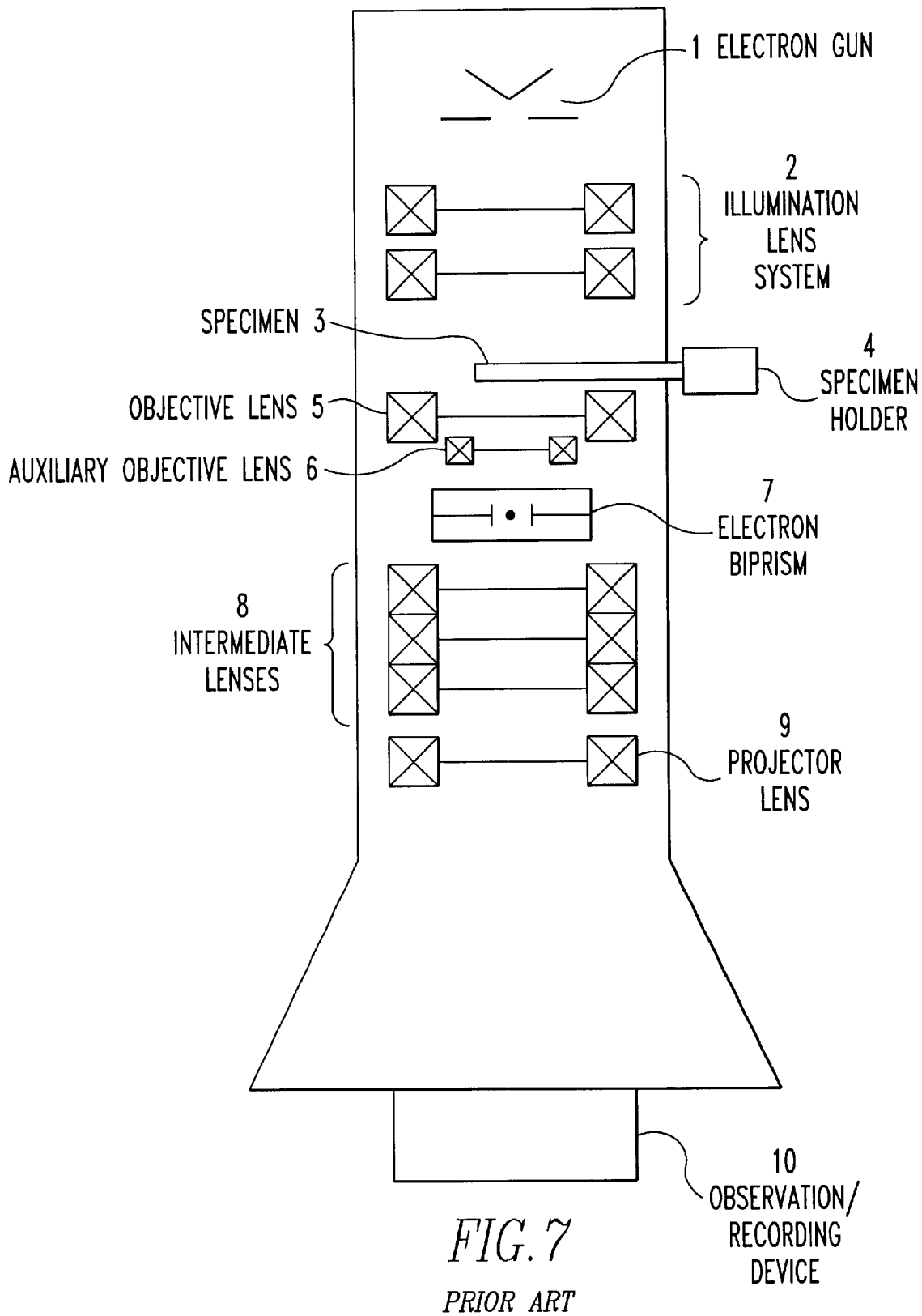
FIG. 7 is a schematic diagram of the prior art holography electron microscope.
Figure 8:
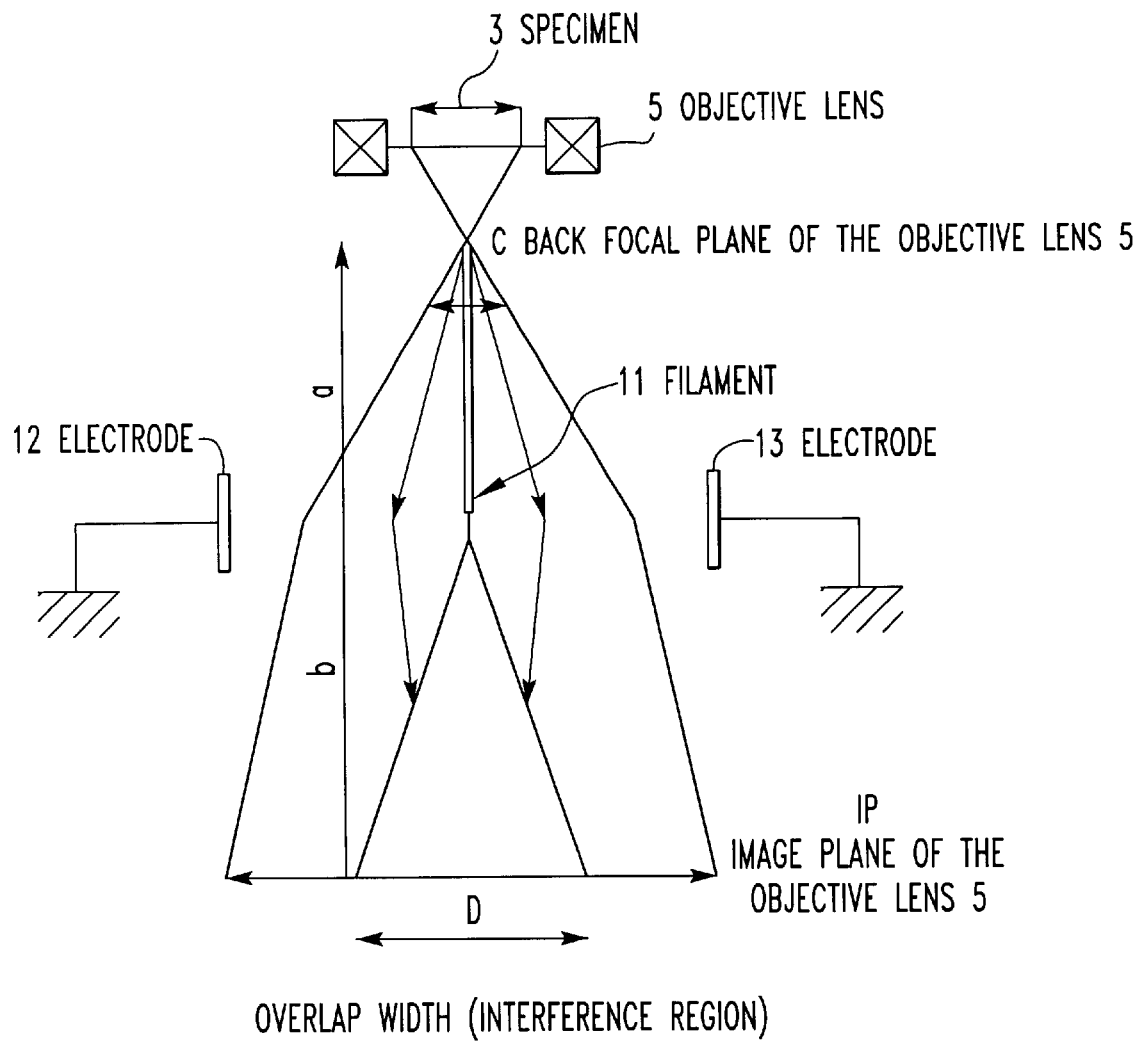
FIG. 8 is a diagram illustrating the operation and the structure of an electron biprism incorporated in the holography electron microscope shown in FIG. 7.

Referring to FIG. 1, there is shown a holography electron microscope in accordance with one embodiment of the present invention. This microscope has a lens power supply 21, a magnification-setting device 22, and an electron biprism power supply 23. In addition, the instrument has components which have been already described in connection with FIG. 7. These components are indicated by the same reference numerals as in FIG. 7.

The magnification-setting device 22 is used to set the magnification of the microscope. The lens power supply 21 determines excitation currents to be supplied to the various lenses to accomplish the magnification set by the magnification-setting device 22, and supplies these excitation currents to the lenses. The electron biprism power supply 23 is used to generate a voltage applied to the filament 11 of the electron biprism 7.

In the holography electron microscope shown in FIG. 1, the electron biprism 7 is located between the system of intermediate lenses 8 and the system of projector lenses 9. The system of intermediate lenses 8 is made up of three or more stages of lenses. The system of projector lenses 9 is made up of two or more stages of lenses.

In operation, the objective lens 5 and the system of intermediate lenses 8 form a crossover at a given position (hereinafter referred to as the intermediate lens crossover position) with respect to the specimen 3 set on the specimen holder 4 by their lens actions. At the same time, they focus a magnified image at a certain image plane position (hereinafter referred to as the intermediate lens image plane position). The intermediate lens crossover position is a given position between the system of intermediate lenses 8 and the electron biprism 7. The intermediate lens image plane position is a given position between the electron biprism 7 and the system of projector lenses 9. The intermediate lens crossover position and the intermediate lens image plane position are fixed independent of the magnification. The system of projector lenses 9 enlarges the magnified image focused at the image plane position and projects it onto the light-sensitive surface of the observation/recording device 10. At this time, the magnification of the system of projector lenses 9 needs to be about 500 times as mentioned later. Therefore, the system of projector lenses 9 should be made up of at least two stages. The magnification of the system of projector lenses 9 may be fixed or variable. Where the magnification is fixed, greater convenience of use is offered.

Figure 2:
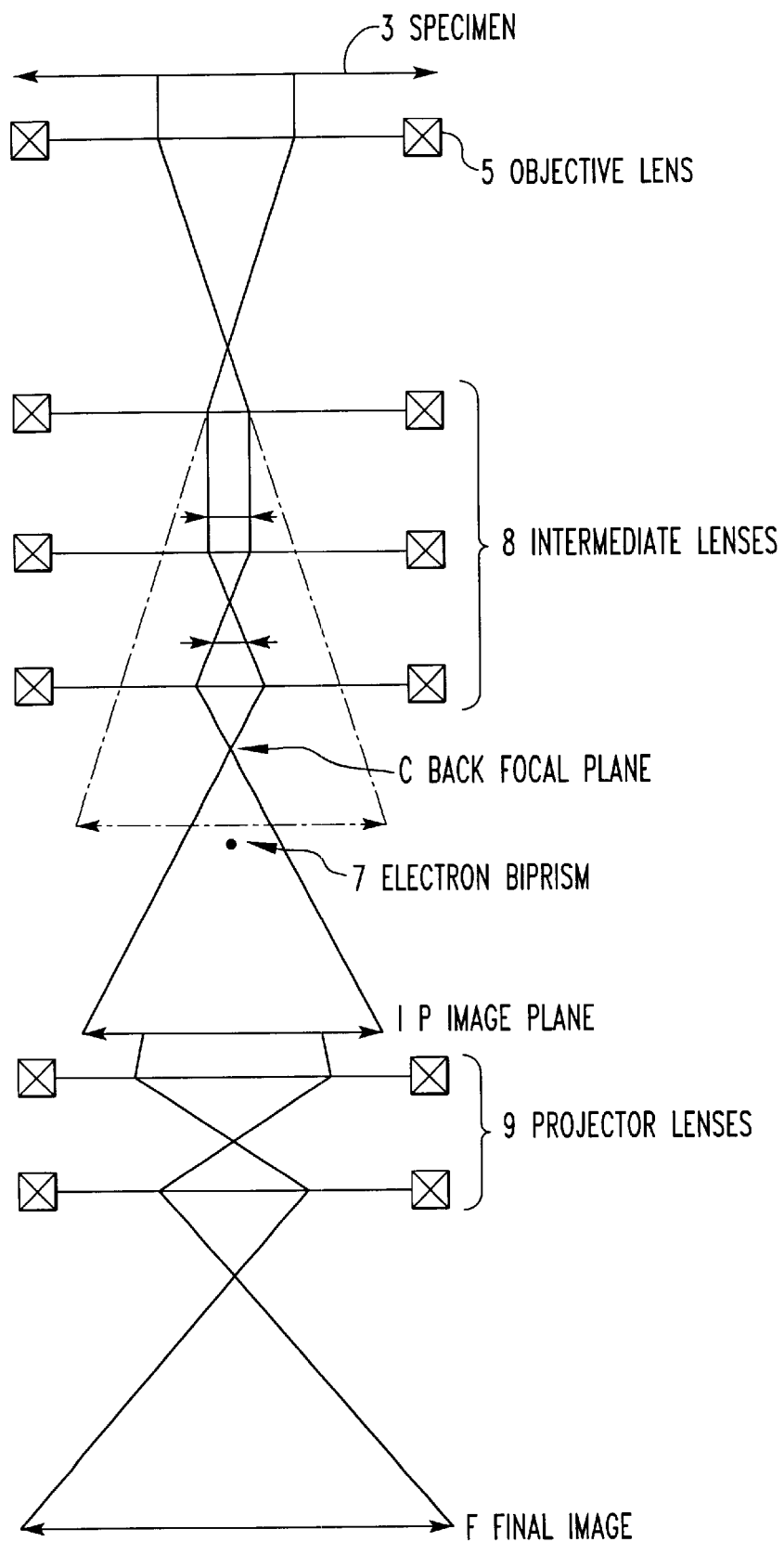
FIG. 2 is a ray diagram of the microscope shown in FIG. 1, and in which the mode of operation is a low magnification mode.
Figure 3:
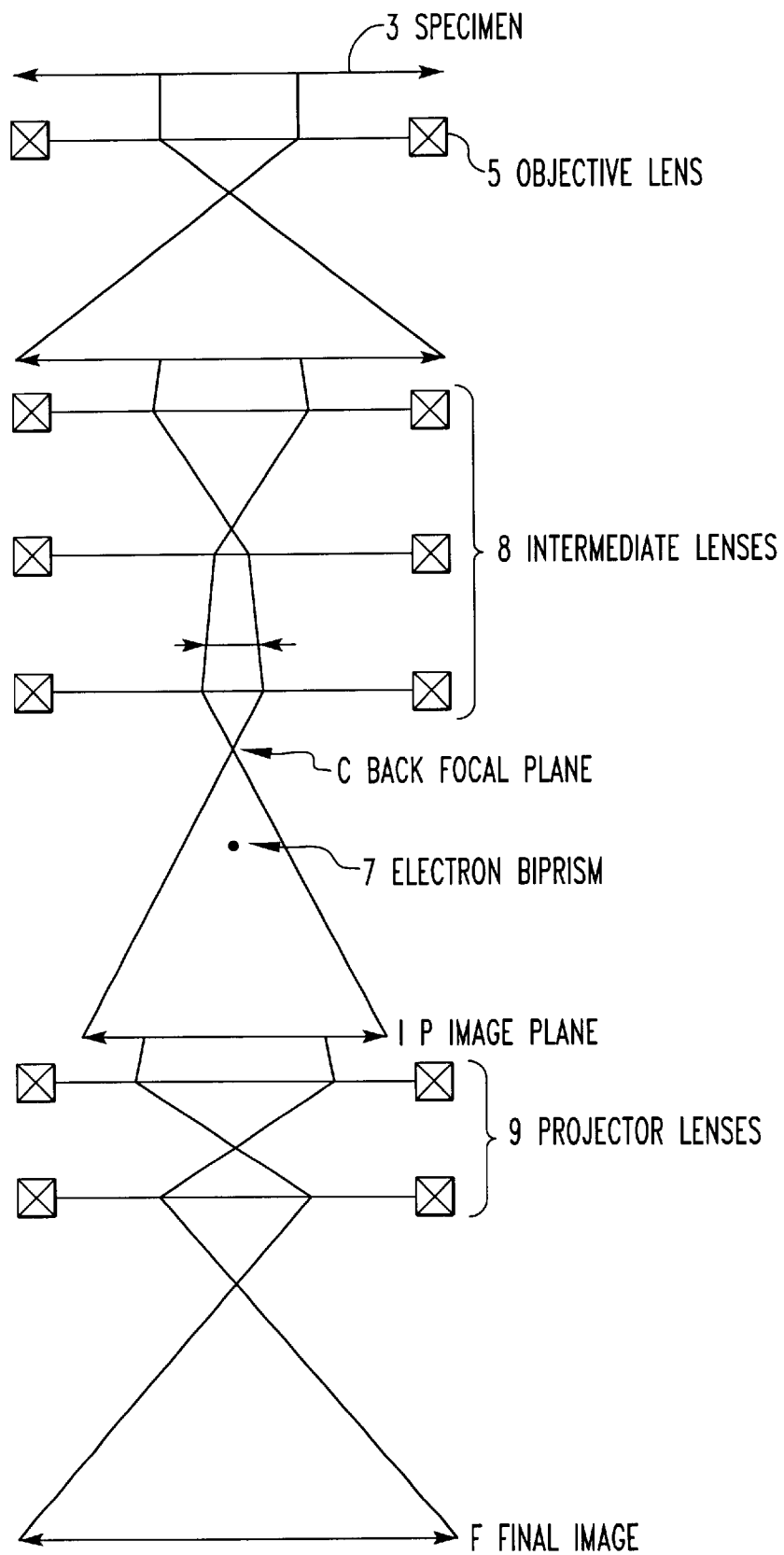
FIG. 3 is a ray diagram similar to FIG. 2, but in which the mode of operation is an intermediate magnification mode.
Figure 4:
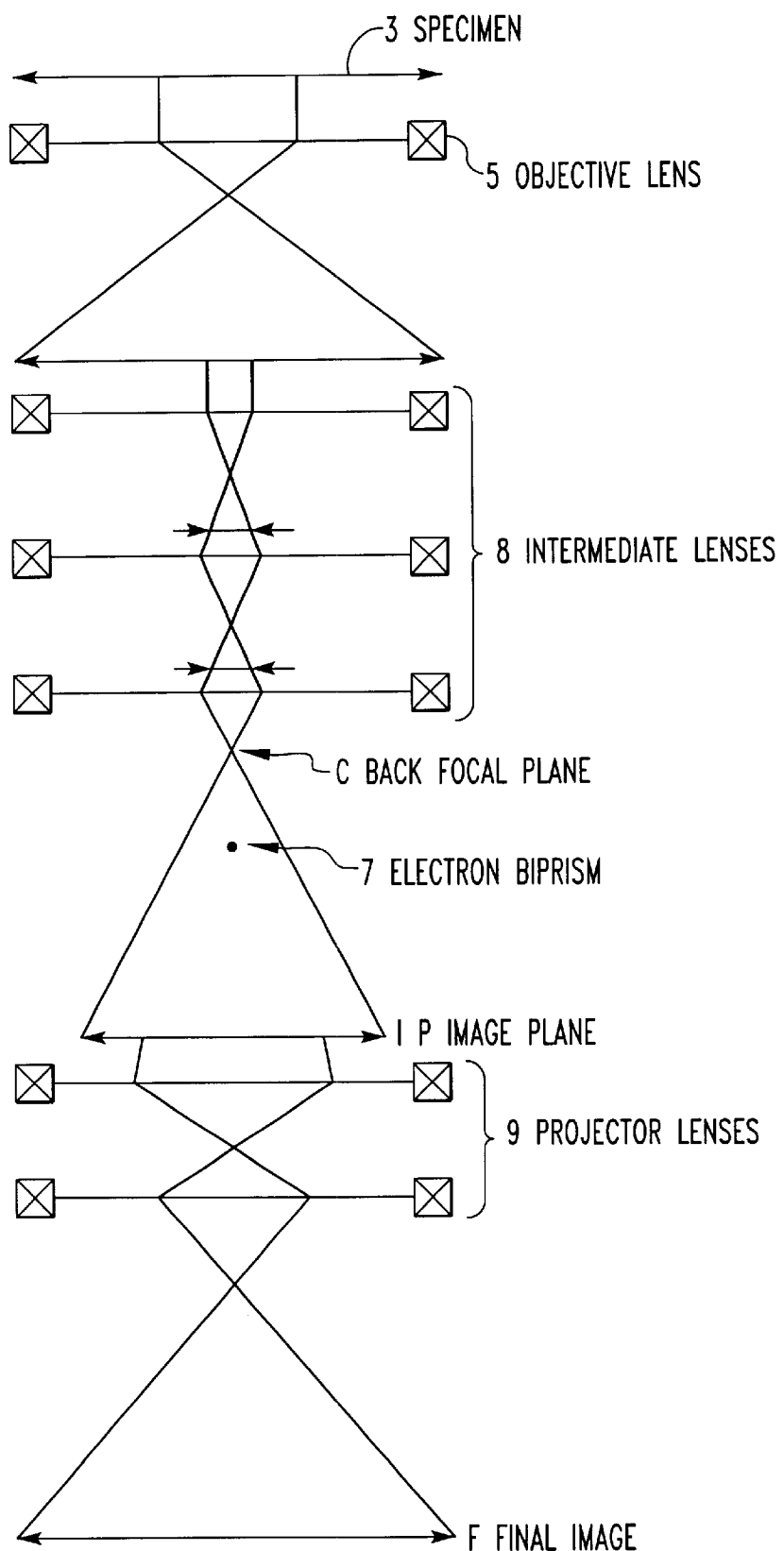
FIG. 4 is a ray diagram similar to FIG. 2, but in which the mode of operation is a high magnification mode.

FIG. 2 is a ray diagram of this instrument in the low magnification mode. FIG. 3 is a ray diagram in the intermediate magnification mode. FIG. 4 is a ray diagram in the high magnification mode. The auxiliary objective lens 6 is omitted in the subsequent figures.

In FIGS. 2, 3, and 4, indicated by C is the intermediate lens crossover position. IP indicates the intermediate lens image plane position. F indicates the final image focused on the light-sensitive surface of the observation/recording device 10.

To permit the magnification to be set to a wide range of values spanning all the magnification ranges including the low, intermediate, and high magnification ranges, the system of intermediate lenses should be made up of at least three stages of lenses if the problem of rotation of the image is also taken into consideration.

In the structure shown in FIG. 1, the electron biprism 7 is positioned between the system of intermediate lenses 8 and the system of projector lenses 9. The system of intermediate lenses 8 is made up of three or more stages of lenses. Therefore, a crossover is formed at the fixed intermediate lens crossover position throughout all magnification ranges including the low, intermediate, and high magnification ranges. Also, a magnified image is focused at the fixed intermediate lens image plane position. The operating conditions of the objective lens 5 and the operating conditions of the system of intermediate lenses 8 are combined to achieve any desired magnification. Consequently, a blank magnification range is not produced, unlike in the prior art technique.

The spacing between the interference fringes and the width of the interference region are next described. Let a be the distance from the intermediate lens crossover position to the filament 11 of the electron biprism 7. Let b be the distance from the filament 11 to the intermediate lens image plane position. Let M1 be the magnification of the image of the specimen 3 at the intermediate lens image plane position. Let M2 be the magnification of the projector lens system 9. Obviously, the magnification M1 is the total magnification of the objective lens 5 and the system of intermediate lenses 8.

Since Eqs. (1) and (2) above can be used intact, the spacing I between the interference fringes at the intermediate lens image plane position and the width D of the interference region are respectively given by Eqs. (1) and (2).

The spacing between the interference fringes of the electron beam hologram finally recorded on the observation/recording device 10 and the width of the interference region are respectively given by:

$$I_{final}=M2 \times I \quad (8)$$

$$D_{final}=M2 \times D \quad (9)$$

These do not depend on the magnification at the intermediate lens image plane position but depend on the magnification of the projector lens system 9.

The spacing $I_{final}$ between the interference fringes and the width $D_{final}$ of the interference region are matched to the size L and the resolution d of the observation/recording device 10 by appropriately selecting a, b, $V_f$, and M2. Under this condition, if the total magnification M=M1×M2 is set by varying the magnifications of the objective lens 5 and the intermediate lens system 8, an image can be recorded invariably under optimum conditions, i.e., at resolution and effective field of view adapted for the observation/recording device 10. Furthermore, any unrealizable magnification range does not exist. Electron holograms can be obtained from a low magnification to a high magnification continuously.

It is assumed that a=20 mm, b=140 mm, φ=1×10⁻⁶ rad/V, $V_{f=200}$ V, and r=0.3 µm. Under this condition, the spacing I between the interference fringes at the intermediate lens imaging plane position is 50 nm, and the width D of the interference region is 51.2 µm. At the magnification M2=500, the spacing $I_{final}$ between the interference fringes at the light-sensitive surface of the observation/recording device 10 is 25.1 µm, and the width $D_{final}$ of the interference region is 25.6 mm. As can be understood from the description made above, the values of spacing $I_{final}$ and width $D_{final}$ do not depend on the total magnification M but depend on the magnification M2 of the projector lens 9.

On the other hand, the interference fringe spacing $I_s$ and the interference region width $D_s$ converted onto the specimen surface depend on the total magnification M and are given by:

$$I_s = \frac{I_{final}}{M} \quad (10)$$

$$D_s = \frac{D_{final}}{M} \quad (11)$$

As can be seen from Eqs. (10) and (11), this holography electron microscope permits hone to vary the interference fringe spacing $I_s$ and the interference region width $D_s$ converted onto the specimen surface by varying the total magnification M. Compared with it, Eqs. (6) and (7) in the prior art technique show that if the objective lens 5 is excited strongly, the focal distance f can be made sufficiently smaller than the sum of the distances (a+b), then the interference fringe spacing $I_s$ and the interference region width $D_s$ converted onto the specimen surface are kept constant.

While one embodiment of the present invention has been described thus far, it is to be understood that the present invention is not limited thereto and that various changes and variations are possible. Modifications of this embodiment are given below.

Figure 5:
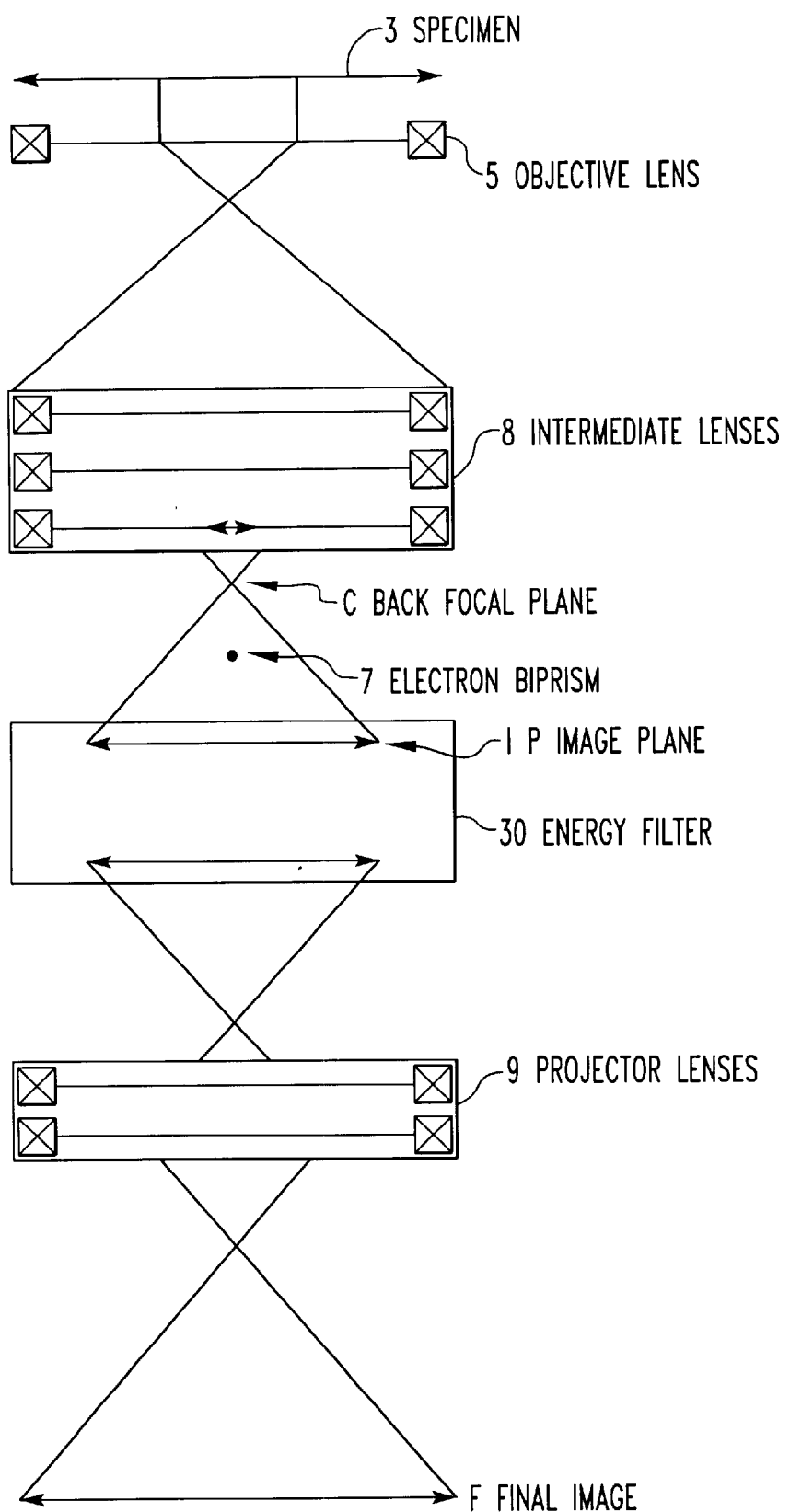
FIG. 5 is a ray diagram showing a modification of the holography electron microscope shown in FIG. 1.

FIG. 5 shows a TEM which is equipped with an imaging energy filter 30 and to which the present invention is applied. As shown in this figure, the intermediate lens crossover position C is made coincident with the incident crossover position of the energy filter 30. The intermediate lens imaging position IP is made coincident with the incident image plane of the energy filter. The electron biprism 7 is inserted between the intermediate lens crossover position C and the intermediate lens image plane IP.

Various known types of energy filters, such as omega type, gamma type, and sector type, can be used as the energy filter 30. A system which deflects electrons from the optical axis of the electron microscope, spectrally disperses them, and then causes them to return to the original optical axis is known as the in-column filter and typified by omega type and gamma type. A system having an energy filter added behind the final lens (projector lens) of a normal electron microscope is known as the post-column filter and typified by the sector type.

Figure 6:
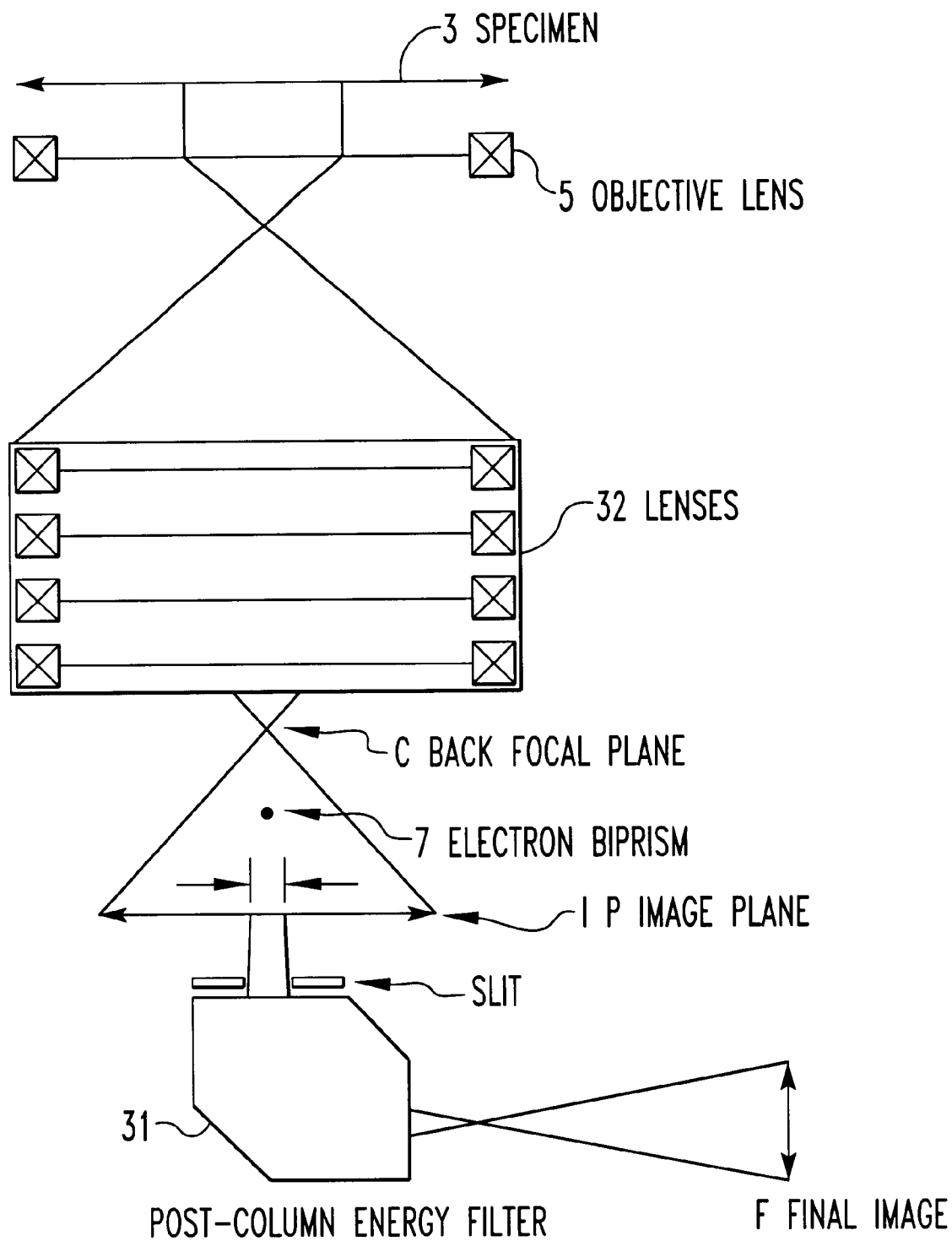
FIG. 6 is a ray diagram showing another modification of the holography electron microscope shown in FIG. 1.

FIG. 6 shows a TEM equipped with a post-column energy filter 31. A set of lenses 32 includes intermediate lenses and projector lenses. Also, in this case, the electron biprism 7 is inserted between the crossover position C of the set of lenses 32 and the image plane position IP.

It can be said that the geometries shown in FIGS. 5 and 6 are fundamentally the same as the geometry shown in FIG. 1 if the energy filter is regarded as a part of the system of projector lenses 9.

As can be understood from the description provided thus far, in the present invention, an electron biprism is positioned between a system of intermediate lenses and an objective lens. The magnification can be varied at will by the objective lens and the system of intermediate lenses which are closer to the electron gun than the electron biprism. A blank magnification range can be eliminated.

Furthermore, the spacing between the interference fringes and the width of the interference region of an electron hologram finally recorded on an observation/recording device depend on the magnification of the system of projector lenses but does not depend on the total magnification. The interference fringe spacing and the interference region width are kept constant at all times. In consequence, an electron hologram can be easily gained without noticing the resolution of the observation/recording device or the effective field of view.

Having thus described our invention with the detail and particularity required by the Patent Laws, what is desired protected by Letters Patent is set forth in the following claims.

What is claimed is:

1. A holography electron microscope comprising:
    a transmission electron microscope (TEM) having an illumination system for directing an electron beam onto a specimen, a magnification-and-projection system for magnifying and projecting a TEM image transmitted through the specimen, and an observation/recording device for observing and recording the projected TEM image, said magnification-and-projection system including an objective lens, a system of intermediate lenses, and a system of projector lenses;
    an electron biprism positioned between said system of intermediate lenses and said system of projector lenses; and
    wherein the lenses of said magnification-and-projection system closer to the specimen than the electron biprism permit one to set the holography electron microscope to any desired magnification.

2. The holography electron microscope of claim 1, wherein said system of intermediate lenses consists of three or more stages of lenses, and wherein said system of projector lenses consists of two or more stages of lenses.

3. A holography electron microscope comprising:
    a transmission electron microscope (TEM) having an illumination system for directing an electron beam onto a specimen, a magnification-and-projection system for magnifying and projecting a TEM image transmitted through the specimen, and an observation/recording device for observing and recording the projected TEM image;
    said magnification-and-projection system consisting of at least one objective lens, three or more stages of intermediate lenses, and two or more stages of projector lenses;
    a magnification-setting means for setting said holography electron microscope to a desired magnification M by adjusting excitation currents supplied to the lenses of said magnification-and-projection system; and
    an electron biprism located between said system of intermediate lenses and said system of projector lenses.

4. The holography electron microscope of claim 3, wherein said magnification M is the product of a first magnification M1 given by a combination of said objective lens and said system of intermediate lenses and a second magnification M2 given by said system of projector lenses, and wherein at least said first magnification M1 can be set at will.

5. A holography electron microscope comprising:

a transmission electron microscope (TEM) having an illumination system for directing an electron beam onto a specimen, a magnification-and-projection system for magnifying and projecting a TEM image transmitted through the specimen, and an observation/recording device for observing and recording the projected TEM image;

said magnification-and-projection system consisting of at least one objective lens, a system of intermediate lenses, and a system of projector lenses;

an electron biprism located between said system of intermediate lenses and said system of projector lenses;

a magnification-setting means for setting said holography electron microscope to a desired magnification M by adjusting excitation currents supplied to the lenses of said magnification-and-projection system;

said observation/recording device being capable of recording interference fringes in an interference region thereon;

said objective lens and said system of intermediate lenses cooperating to provide a first magnification M1 on which spacing between said interference fringes or width of said interference region on said observation/recording device is not dependent;

said system of projector lenses providing a second magnification M2; and said magnification M being the product of said first magnification M1 and said second magnification M2 (M=M1×M2).

* * * * *

UNITED STATES PATENT AND TRADEMARK OFFICE
CERTIFICATE OF CORRECTION

PATENT NO.  : 6,573,501 B2
DATED       : June 3, 2003
INVENTOR(S) : Toshikatsu Kaneyama et al.

It is certified that error appears in the above-identified patent and that said Letters Patent is hereby corrected as shown below:

Column 2,
Line 26, "V $_f$is" should read -- $V_f$ is --.
Line 27, "Φ" should read -- φ --.

Column 3,
Line 16, "Φ" should read -- φ --.
Line 30, "V $_f$applied" should read -- $V_f$ applied --.

Column 7,
Line 24, "hone" should read -- one --.

Signed and Sealed this

Second Day of December, 2003

JAMES E. ROGAN
*Director of the United States Patent and Trademark Office*